United States Patent
Satoh et al.

(10) Patent No.: US 6,742,694 B2
(45) Date of Patent: Jun. 1, 2004

(54) SOLDER BALL DISPOSING APPARATUS, SOLDER BALL REFLOW APPARATUS, AND SOLDER BALL BONDING APPARATUS

(75) Inventors: Takuya Satoh, Kanagawa-ken (JP); Tatsumi Tsuchiya, Ayase (JP); Yasuhiro Mita, Fujisawa (JP); Lan Shi, Fujisawa (JP); Hiroyoshi Yokome, Fujisawa (JP); Tatsushi Yoshida, Chigasaki (JP); Surya Pattanaik, San Jose, CA (US)

(73) Assignee: Hitachi Global Storage Technologies Netherlands B.V. (NL)

( * ) Notice: Subject to any disclaimer, the term of this patent is extended or adjusted under 35 U.S.C. 154(b) by 173 days.

(21) Appl. No.: 10/074,718

(22) Filed: Feb. 13, 2002

(65) Prior Publication Data

US 2002/0113115 A1 Aug. 22, 2002

(30) Foreign Application Priority Data

Feb. 16, 2001 (JP) ......................................... 2001-039888

(51) Int. Cl.[7] .............................. B23K 1/00; B23K 5/00; B23K 20/14; B23K 37/00
(52) U.S. Cl. ............................. 228/41; 228/4.1; 228/6.2
(58) Field of Search .......................... 228/41, 4.1, 6.2, 228/44.3, 44.7; 219/121.6, 121.65, 121.73, 121.76

(56) References Cited

U.S. PATENT DOCUMENTS

| | | | | |
|---|---|---|---|---|
| 4,278,867 A | * | 7/1981 | Tan ........................ | 219/121.64 |
| 5,653,381 A | * | 8/1997 | Azdasht ...................... | 228/254 |
| 5,821,494 A | * | 10/1998 | Albrecht et al. ........ | 219/121.64 |
| 5,828,031 A | * | 10/1998 | Pattanaik ............... | 219/121.63 |
| 6,046,882 A | * | 4/2000 | Pattanaik et al. ............. | 29/878 |
| 6,318,624 B1 | * | 11/2001 | Pattanaik et al. .......... | 228/56.3 |
| 6,336,581 B1 | * | 1/2002 | Tuchiya et al. ................ | 228/33 |
| 6,341,415 B2 | * | 1/2002 | Amemiya et al. ........ | 29/603.06 |
| 6,459,549 B1 | * | 10/2002 | Tsuchiya et al. .......... | 360/245.9 |
| 6,523,250 B2 | * | 2/2003 | Erpelding et al. ........ | 29/603.04 |
| 6,539,609 B2 | * | 4/2003 | Palmer et al. ........... | 29/603.03 |
| 6,543,677 B2 | * | 4/2003 | Pattanaik et al. ........... | 228/246 |
| 6,553,647 B1 | * | 4/2003 | Itoh et al. ................. | 29/603.06 |
| 6,589,594 B1 | * | 7/2003 | Hembree ..................... | 427/97 |

* cited by examiner

Primary Examiner—Stanley S. Silverman
Assistant Examiner—Colleen P. Cooke
(74) Attorney, Agent, or Firm—Robert B. Martin; Bracewell & Patterson, L.L.P.

(57) ABSTRACT

An apparatus joins bonding pads of a slider and lead pads of lead wires in a head gimbals assembly to improve efficiency, downsizing, and maintenance of solder-ball disposing devices, and solder-ball reflow devices for reflowing solder balls. The solder-ball disposing apparatus discharges solder balls from solder-ball discharging holes of a solder-ball feeder unit which are evacuated by a suction pad. An environmental space and an inert-gas supply portion for forming inactive atmosphere are formed on a table to eliminate an inert-gas supply unit from an optical unit, so that converged laser beams are directly radiated onto the solder balls.

3 Claims, 8 Drawing Sheets

[Figure 1]
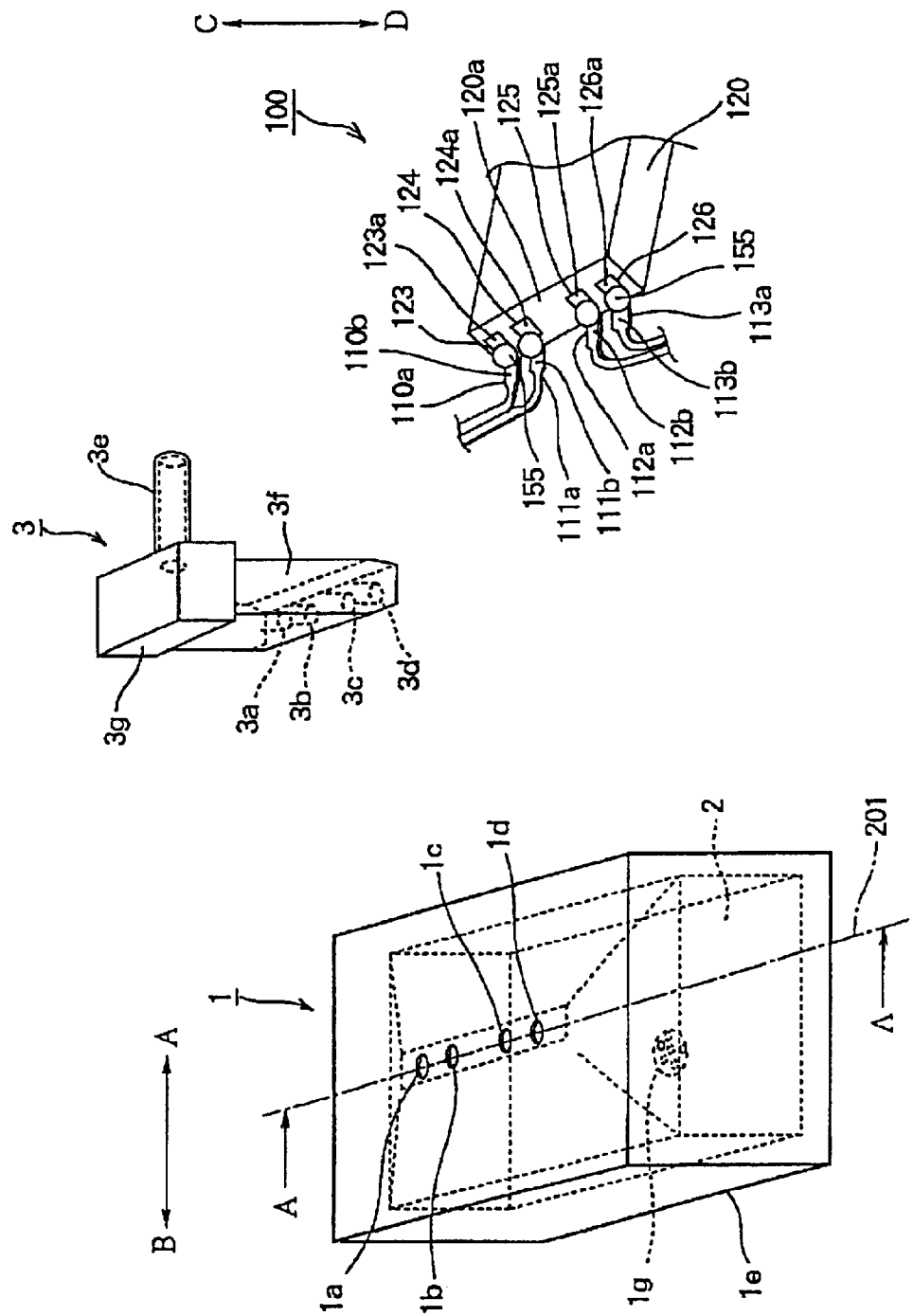

[Figure 2]
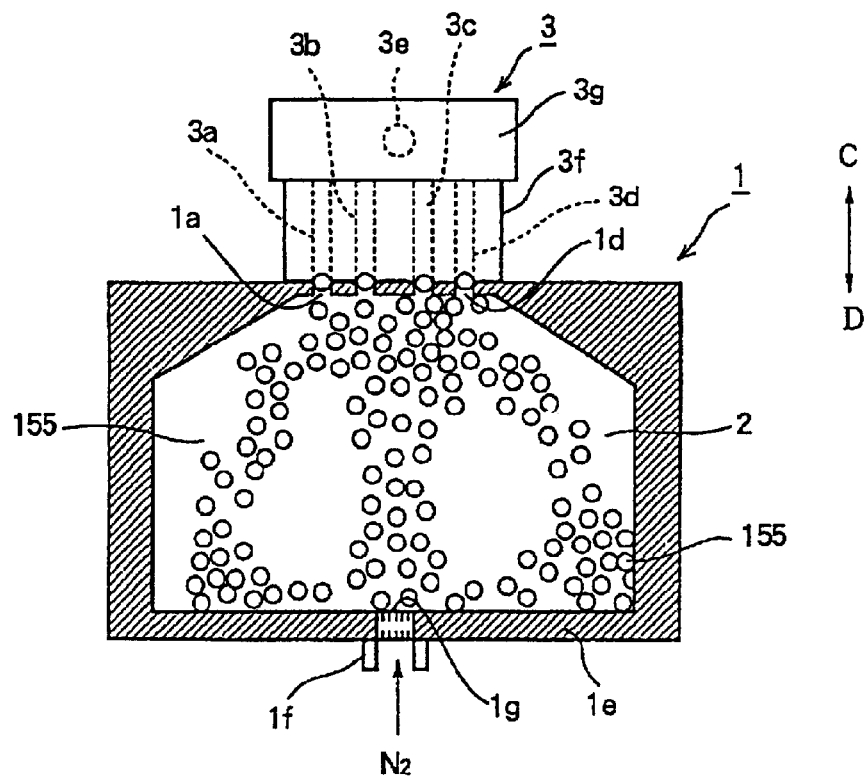
[Figure 3]
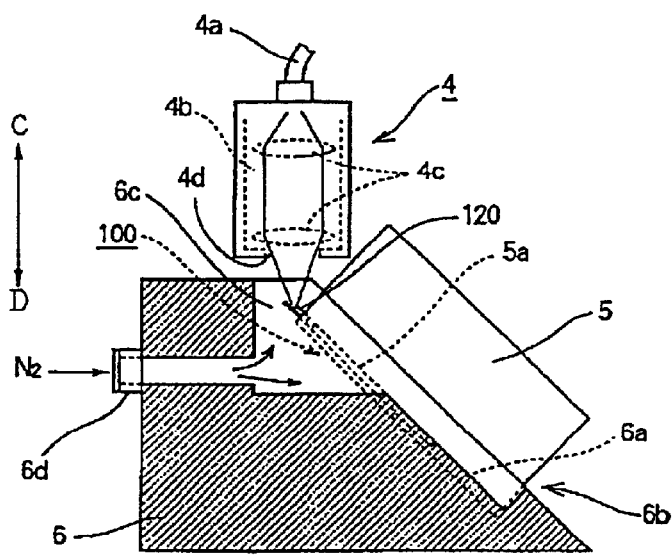

[Figure 4]
(a)
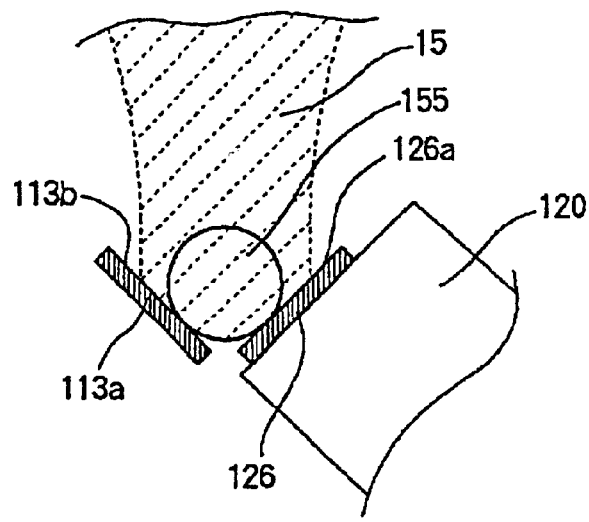
(b)
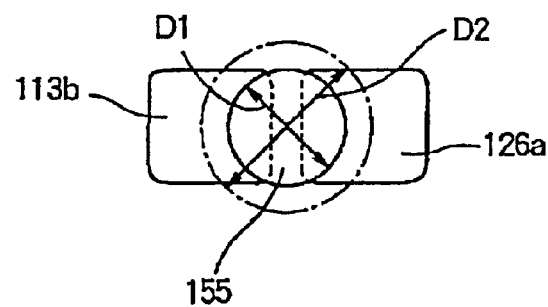

[Figure 5]
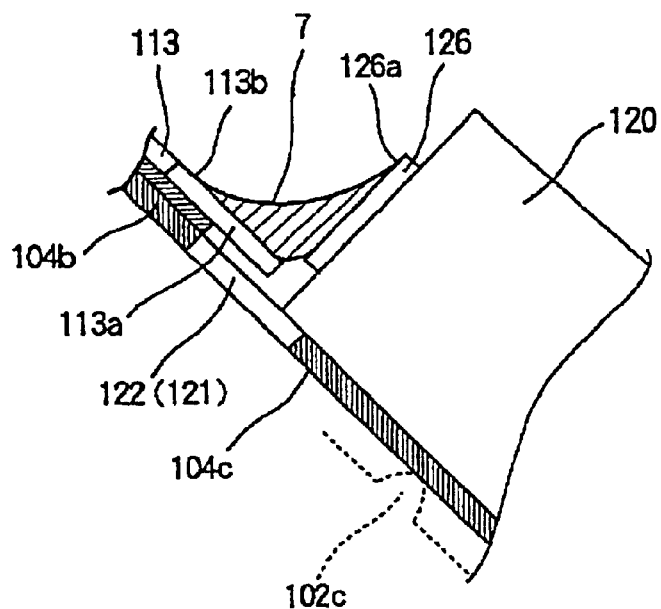
[Figure 6]
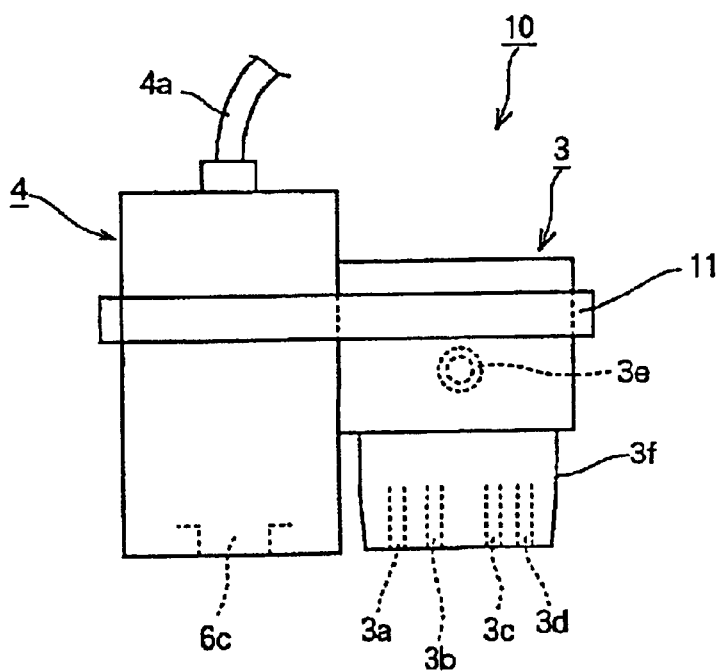

[Figure 7]
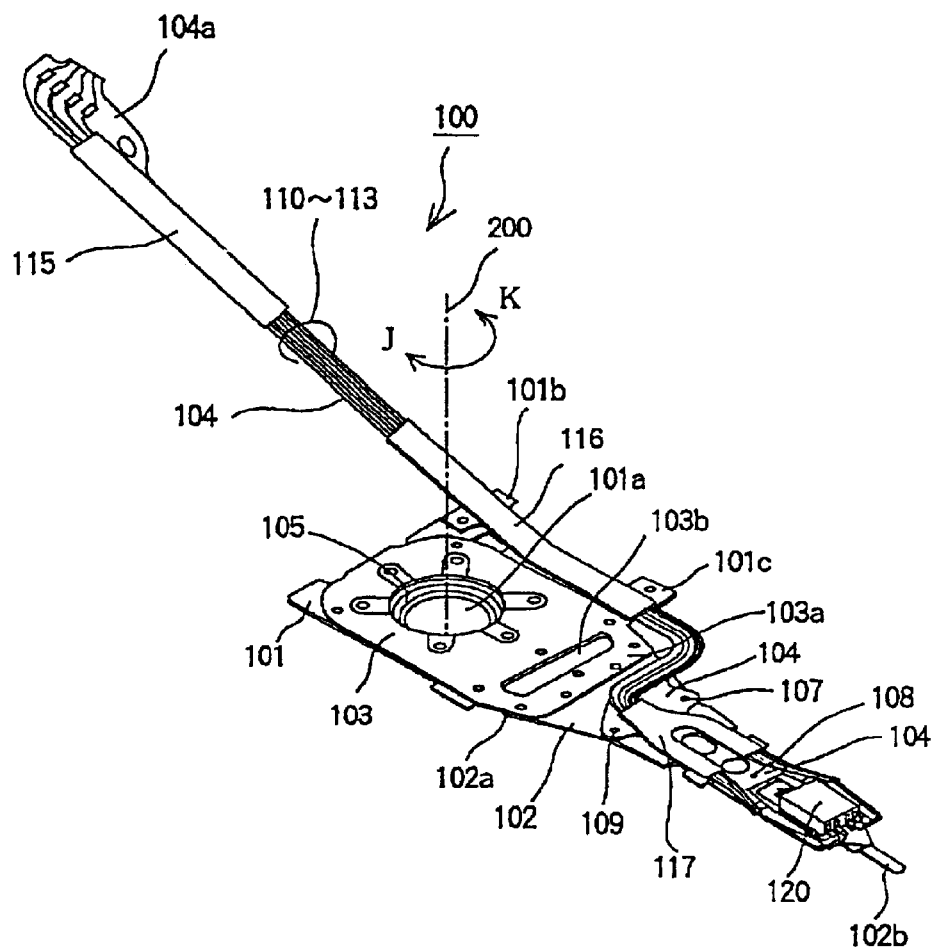

[Figure 8]
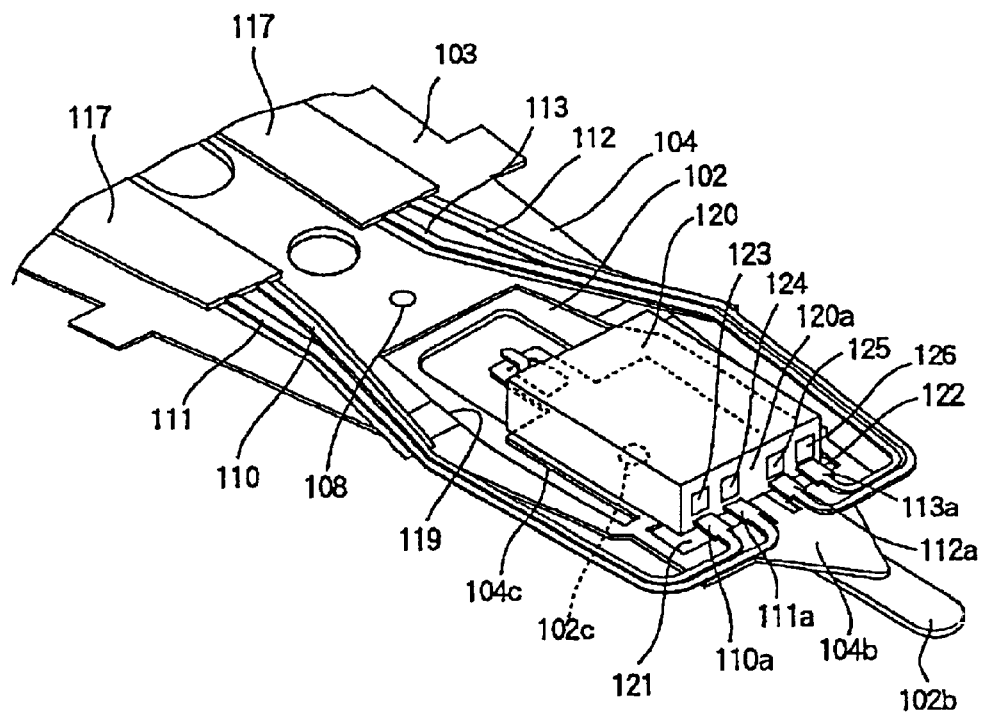

[Figure 9]
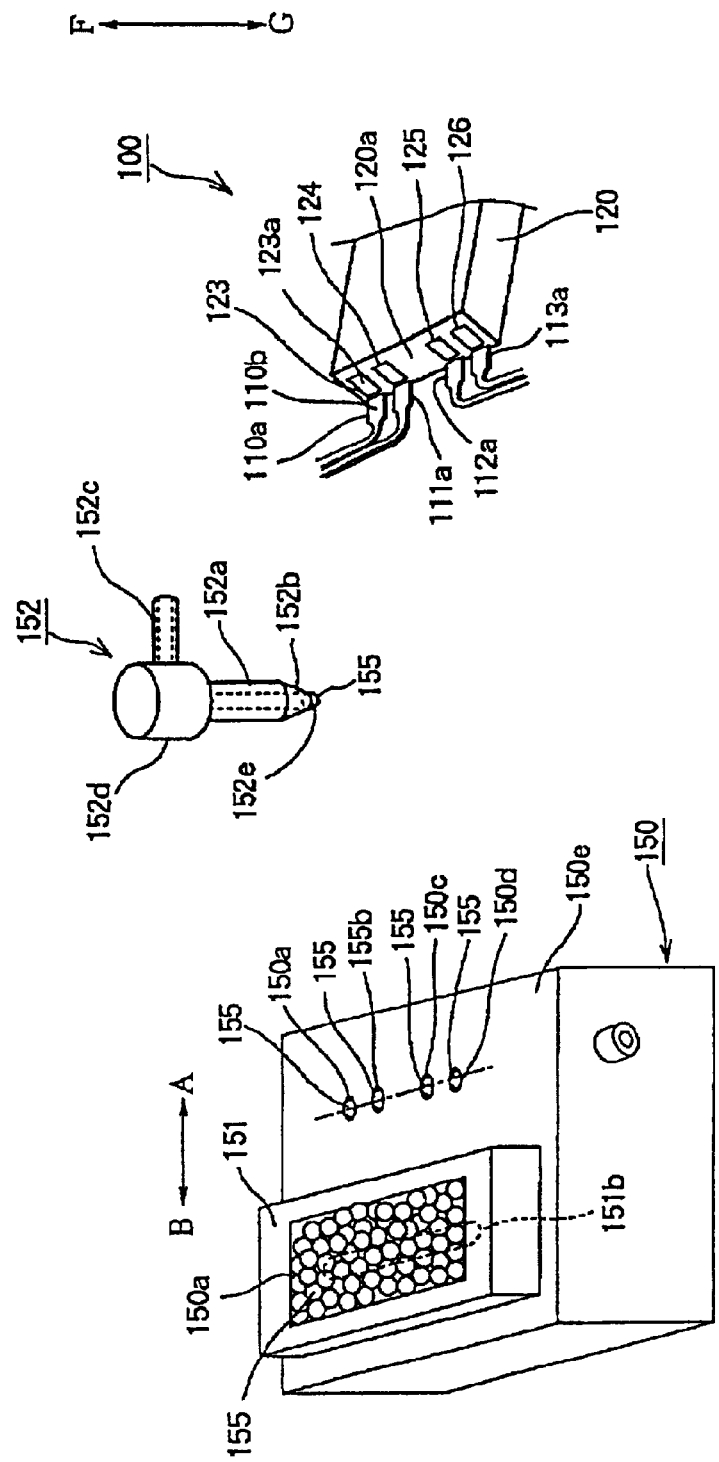

[Figure 10]
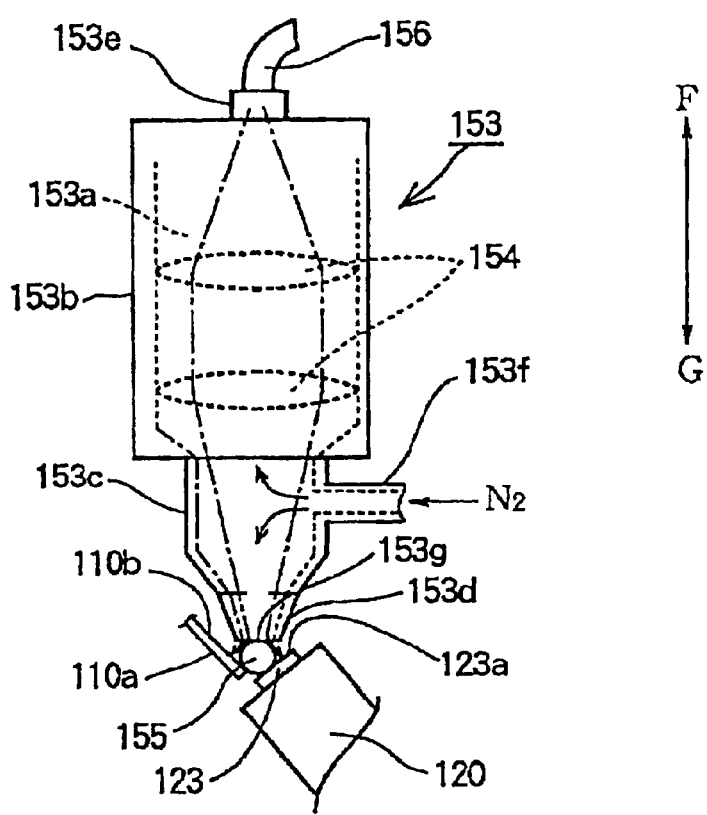

SOLDER BALL DISPOSING APPARATUS, SOLDER BALL REFLOW APPARATUS, AND SOLDER BALL BONDING APPARATUS

This application claims the priority benefit of Japanese Patent Application No. 2001-039888, filed on Feb. 16, 2001, and entitled "Solder Ball Disposing Apparatus, Solder Ball Reflow Apparatus, and Solder Ball Bonding Apparatus."

BACKGROUND OF THE INVENTION

1. Technical Field

The present invention relates to an apparatus for bonding a bonding pad formed on the slider for disposing the head of a head gimbal assembly (hereafter referred to as an HG assembly), which is a component of a hard disk drive, to a lead pad formed on the tip of a lead wire with a solder ball.

2. Description of the Related Art

FIG. 7 is a perspective view of an HG assembly suitable for electrically bonding a lead wire to a slider using solder ball bonding, and FIG. 8 is a partially enlarged view of an end of the HG assembly shown in FIG. 7.

A main structure of the HG assembly 100 is composed of a base plate 101, a load beam 102, a suspension plate 103, and a flexure 104. An opening 101a is formed on the base plate 101 and a reinforcing ring 105 is fixed to the bottom side, viewed in FIG. 7, of the circumference of the opening 101a. The opening 101a is used when the HG assembly 100 is pivotably held by the HG holding means of a magnetic disk apparatus (not shown), and the HG assembly 100 pivots around the virtual vertical line 200 passing through the center of the opening 101a as the axial center in the J-K directions shown by an arrow.

An end 102a of the load beam 102 is fixed to the protruded portion 103a of the suspension plate 103 bonded to the base plate 101, and is elastically held on the base plate 101 by the suspension effect desirably obtained by the opening 103b formed in the suspension plate 103. The load beam 102 also extends in the radial direction of the virtual vertical line 200, and a tab 102b extending in the same direction is formed on another end of the load beam 102.

The flexure 104 extends from the tip of the HG assembly 100 to a multi-collector portion 104a in a crank shape, and laser-welded to the load beam 102 at joining points 107, 108, and 109, and fixed to and held by the base plate 101 at the protruded holders 101b and 101c. Four lead wires 110–113 are disposed on the upper surface (the surface seen in the upper side in FIG. 7) of the flexure 104 through an insulating sheet so as not to contact with each other. The main portions of these lead wires 110–113 are protected by protective sheets 115, 116, and 117, and the ends of these lead wires 110–113 are disposed in a line on the multi-connector portion 104a to form a connecting surface.

As shown in FIG. 8, the vicinity of the tip of the flexure 104 is fixed to the load beam 102 at the joining point 108, and the portion of the flexure 104 beyond the joining point 108 is freed from the load beam 102. In this portion, an arch-shaped opening 119 is formed, and a slider 120 is adherent and fixed to the flexure tongue 104c formed to protrude toward the center of the arch-shaped opening 119 from the platform 104b that constitutes the endmost portion of the flexure 104 (see FIG. 5).

This flexure tongue 104c is supported at a point by a pivot 102c protruded from the load beam 102 (also shown in FIG. 5 by a broken line) at the position corresponding to the center portion of the slider 120. Thereby, the slider 120 can have a prescribed amount of tilt (also often called pitch, roll, or yaw) to all direction from the load beam 102.

As shown in FIG. 7, four lead wires 110 to 113 run toward the far end forming pairs from the vicinity of the protective sheet 117, bend substantially normal at the arch-shaped opening 119 (FIG. 8) in a floating state, and terminate on the platform 104b. Here, the paired lead wires bend so as to be substantially normal to the front surface 120a of the slider 120 over two openings 121 and 122 formed between the platform 104b and the flexure tongue 104c, and further form lead pads 110a to 113a to correspond to the pad bonding surfaces of four bonding pads 123 to 126 formed on the front surface 120a of the slider 120, respectively.

Next, a bonding method by a conventional solder-ball bonding apparatus for electrically connecting four bonding pads 123 to 126 with lead pads 110a to 113a formed corresponding thereto, respectively, will be described below.

Of the above-described HG assembly, the portions other than the slider are equivalent to the slider 120 holding means. An example of this bonding method is disclosed in Japanese Patent Application No. 2000-189,148, by the present applicant. This method is implemented by a solder-boll holder 150, a suction pad 152, and an optical unit 153 shown in FIGS. 9 or 10.

The solder-ball holder 150 shown in FIG. 9 has four solder-ball holding holes 150a to 150d formed on the upper surface 150e at prescribed distances. The hopper 151 is a box-shaped member held movably in A-B direction shown by the arrow on the upper surface 150e of the solder-ball holder 150, and has a storage 151a for storing a large number of solder balls 155. On the bottom of the storage 151a is formed a slot 151b for discharging solder balls 155. When the hopper 151 moved to the discharging position to cover the four solder-ball holding holes 150a to 150d, it feeds one ball 155 to each of the solder-ball holding holes. FIG. 9 shows the state when a ball is held by each solder-ball holding hole.

The suction pad 152 is composed of a cylindrical portion 152a that has a spatially continuous hollow portion, a conical portion 152b that has a suction hole 152e at the end, a discharging pipe 152c, and a connecting portion 152 that connects these components as shown in FIG. 9. The discharging pipe 152c is connected to a suction means (not shown), and balls are discharged from the discharging pipe 152c in the timing described later.

The suction pad 152 is carried by a carrier (not shown), approaches sequentially to the four solder-ball holding holes 150a to 150d of the solder-ball holder 150, and sucks and carries the solder ball 155 held by each solder-ball holding hole. FIG. 9 shows the state when the suction pad 152 sucks and carries the solder balls.

The solder balls are carried along a prescribed route, and suction is released at the position, for example, where a solder ball 155 comes in contact with the pad bonding surface 123a of the bonding pad 123 and the bonding surface 110b of the lead pad 110a, in the HG assembly 100 held in a state tilted by about 45 degrees against the F-G direction (vertical direction). At this time, the solder ball 155 stops in the state of point contact to both bonding surfaces.

FIG. 10 is a constitutional diagram showing the state when the optical unit 153 for reflowing solder balls 155 is approached to a solder ball, which stops in contact with the pad bonding surface 123a of the bonding pad 123 and the bonding surface 110b of the lead pad 110a, as described above, together with the major constitution of the optical unit 153 itself.

The optical unit 153 is composed of a lens holder 153b that has a hollow laser-beam path space 153a formed inside and holds a series of condenser lenses 154 disposed on the laser-beam path, a nitrogen gas inlet 153c for introducing nitrogen gas $N_2$ into the laser-beam path space 153a, a tip 153d to approach a solder ball 155 and output converged laser beams, and a laser-beam introducing port 153e connected to optical fibers 156 for introducing laser beams into the laser-beam path space 153a.

The nitrogen gas inlet 153c has a nitrogen gas inlet 153f, and a laser-beam output opening 153g for radiating converged laser beams to the solder ball 155 is formed on the tip 153d. The optical fibers 156 are optically connected to a laser oscillator (not shown), and leads the laser beams outputted from the laser oscillator to the laser-beam introducing port 153e.

The optical unit 153 composed as described above is moved by a moving means (not shown) to the radiating position where a part of a solder ball 155 has approached to the laser-beam output opening 153g of the optical unit 153 so as to able to enter the opening 153g. Then, nitrogen gas $N_2$ is introduced and converged laser beams are radiated onto the solder ball 155 in the state where nitrogen gas $N_2$ is blown to the solder ball 155 at the predetermined gas pressure, to execute solder reflow. The nitrogen gas $N_2$ which flows out at this time, pushes the molten solder against each bonding surface, and coats the solder to prevent the solder from oxidation.

3. Problems to be Solved by the Invention

Using the above-described conventional solder-ball bonding method, if each solder ball is improperly held in each solder-ball holding hole of the solder-ball holder 150, the solder ball may be cut or broken when the hopper 151 moves. Also, since the process step to feed a solder ball into each solder-ball holding hole is independent from the process step to withdraw the solder ball from the solder-ball holding hole, the transportation work of solder balls is inefficient.

Also, since the suction pad transports solder balls one after another, the transportation of solder balls is time consuming, because aggregated traveling distance increased when a plurality of solder balls are transported, and all the transportation must be performed in high accuracy.

Also, when the reflow of solder balls is performed by radiating laser beams, since the operation is conducted in the state where nitrogen gas $N_2$ is blown to the solder balls under a prescribed gas pressure, a hollow nitrogen-gas inlet 153c is required, thereby making the configuration of the optical unit complicated, and when the nitrogen-gas inlet 153c is installed, it is difficult to align the center of the beam path with the axis of laser beams, requiring a long time for adjustment. Furthermore, since the end portion 153d approaches a solder ball extremely closely, solder adheres the end portion easily at the time of reflow, and the maintenance of the optical unit, such as the replacement of parts, is difficult.

Furthermore, since laser beams are reflected from the inner wall of the nitrogen-gas inlet 153c or the end portion 153d, the radiation efficiency lowers, and a high-output laser is required for obtaining radiation energy required for the reflow of solder balls.

An object of the present invention is to solve these problems, and to provide a method for solder-ball bonding that excels in efficiency and workability.

SUMMARY OF THE INVENTION

A solder ball disposing apparatus according to claim 1 is characterized by a solder ball disposing apparatus for making a solder ball stationary in a state where the ball is in contact with a first bonding surface of a pad formed on a slider held by slider holding means for a disk drive; and a second bonding surface of a pad formed on an end portion of a lead disposed on the slider holding means, and positioned in the vicinity of and substantially perpendicularly to the plane including the first bonding surface, and the solder ball disposing apparatus includes:

a solder-ball feeder unit positioned apart from the slider holding means that holds the slider in which each of the first and second bonding surfaces is held obliquely from a vertical direction by a prescribed distance, accommodates a plurality of solder balls in the internal space thereof, and has ejecting holes formed on the bottom of the internal space for ejecting a gas to blow the solder balls and solder-ball discharging holes formed in the upper portion of the internal space for discharging the blown solder balls out of the solder-ball feeder unit; and a suction pad having a suction hole formed on the tip for sucking solder balls discharged from the discharging holes into the suction hole, and transporting and releasing the solder balls to and at the location where the solder balls contact the first and/or second bonding surface(s), or approach the first and second bonding surfaces.

BRIEF DESCRIPTION OF THE DRAWINGS

FIG. 1 is a perspective view showing the appearances of a solder-ball supply unit and a suction pad for sucking and holding to carry solder balls, which constitute a solder-ball bonding apparatus according to a first embodiment of the present invention;

FIG. 2 is a sectional view of a cross-section of the solder-ball supply unit shown in FIG. 1 including a reference line 201 on which four solder-ball discharging holes 1a to 1d are arrayed, viewed from an A—A direction shown by arrows;

FIG. 3 is a diagram showing major configurations of an optical unit 4, a jig 5, and a table 6 on which the jig 5 is held, which constitute the solder-ball bonding apparatus according to The first embodiment of the present invention;

FIG. 4(a) is a diagram showing a radiating portion viewed from a direction normal to an optical axis of laser beams 15;

FIG. 4 (b) is a diagram showing the radiating portion viewed from the direction of the optical axis of laser beams 15;

FIG. 5 is a diagram showing a state of reflow bonding formed by the reflow of a solder ball;

FIG. 6 is a diagram showing the appearance of a movable portion of the solder-ball bonding apparatus in which a suction pad and an optical unit are integrally constituted according to a second embodiment of the present invention;

FIG. 7 is a perspective view showing an HG assembly suitable for electrically connecting lead wires to a slider by solder-ball bonding;

FIG. 8 is an enlarged view showing the end portion of the HG assembly;

FIG. 9 is a diagram showing the configuration of a conventional solder-ball holding apparatus; and FIG. 10 is a diagram showing the configuration of a conventional solder-ball holding apparatus.

DETAILED DESCRIPTION OF THE PREFERRED EMBODIMENT

First Embodiment

FIG. 1 is a perspective view showing appearances of a solder-ball supply unit and a suction pad for sucking and holding to carry solder balls, which constitute a solder-ball bonding apparatus according to The first embodiment of the present invention. In FIG. 1, a solder-ball supply unit 1 has a hollow rectangular parallelepiped shape, and on an upper surface thereof, four solder-ball discharging holes 1a to 1d connected to an internal space 2 are formed on a reference line 201 at prescribed distances. These distances are designed to be equal to distances between bonding pads 123, 124, 125, and 126 formed on the front surface 120a of the slider 120 shown in FIG. 8.

FIG. 2 is a sectional view of the cross-section of the solder-ball supply unit shown in FIG. 1 including the reference line 201 on which four solder-ball discharging holes 1a to 1d are arrayed, viewed from the A—A direction shown by the arrows. As shown FIG. 2, a large number of solder balls 155 are accommodated in the internal space 2 of the solder-ball supply unit 1. On the location in the bottom 1e of the solder-ball supply unit 1, facing substantially the center of the four solder-ball discharging holes 1a to 1d, ejecting holes 1g to introduce nitrogen gas $N_2$ from an external source into the internal space 2, as described later, are formed.

These ejecting holes 1g are composed of a plurality of cylindrical holes each having a diameter smaller than the diameter of a solder ball 155 so that the solder balls accommodated in the internal space 2 cannot drop through these ejecting holes, and are spatially connected to the hollow portion of the ventilation pipe 1f continuously formed downward. This ventilation pipe 1f is connected to a nitrogen-gas cylinder (not shown), and introduces nitrogen gas $N_2$ in the timing described later.

The solder-ball supply unit 1, constituted as described above, is held by the holding means, which is described later, in the vicinity of the HG assembly 100 in which the bonding surfaces of the bonding pads 123, 124, 125, and 126 and lead pads 110a, 111a, 112a, and 113a are held at an angle of about 45 degrees, the reference line 201 is parallel to the front surface 120a of the slider 120, and four solder-ball discharging holes 1a, 1b, 1c, and 1d are arrayed so as to correspond to bonding pads 123, 124, 125, and 126, respectively.

The suction pad 3 is held by a moving means (not shown), and holds a manifold 3f having four suction holes 3a to 3d formed on the bottom surface, and a discharging pipe 3e extending in the direction normal to this manifold 3f; and has a connecting portion 3g that spatially connects the hollow portion of the discharging pipe 3e with the four suction holes 3a to 3d. The distances between the four suction holes 3a to 3d formed on the bottom surface of the manifold 3f are designed so as to be equal to the distances between the four solder-ball discharging holes 1a to 1d, or between the bonding pads 123 to 126. Furthermore, this discharging pipe 3e is connected to the suction means (not shown) and the solder ball is evacuated from the discharging pipe 3e in the timing described later.

The solder-ball supply unit 1, the suction pad 3, and the moving means (not shown) for transporting the suction pad 3 correspond to the solder ball disposing apparatus. The operation to transport solder balls by the suction pad 3 in the above-described configuration will be described below. First, the suction pad 3 is moved by a moving means (not shown) to the position where the four suction holes 3a to 3d face and are a little apart from the four solder-ball discharging holes 1a to 1d of the solder-ball supply unit 1, respectively. The position of the suction pad 3 is shown in the sectional view of FIG. 2. In the timing around this movement of the suction pad 3, a suction means connected to the discharging pipe 3e of the suction pad 3 is operated to establish the suction state where each of the four suction holes 3a to 3d sucks an approaching solder ball 155.

After the suction pad 3 has moved into the suction state, a prescribed flow rate of nitrogen gas $N_2$ is introduced into the solder-ball supply unit 1 through the ventilation pipe 1f, and is ejected in the internal space 2 through the ejecting holes 1g. This ejection of the nitrogen gas $N_2$ blows solder balls in the vicinity of the ejecting holes 1g upward in the vertical direction (C-direction shown by the arrow).

The blown solder balls repeat circulating movement, in which they reach the upper portion of the internal space 2, move toward the circumference, return to the vicinity of the ejecting holes 1g by natural falling, and are blown upward again In the process ofthis movement, solder balls 155 that have reached the vicinity of the four solder-ball discharging holes 1a to 1d formed on the upper surface of the internal space 2 are accelerated by the suction force of the four suction holes 3a to 3d of the suction pad 3 that approached the discharging holes, and made to be in the suction state quickly sucked into the solder-bail discharging holes.

Thus, the four solder-ball discharging holes 1a to 1d are closed by solder balls 155 sucked in the corresponding suction holes 3a to 3d of the suction pad 3, respectively, and other solder balls repeat circulating movement. The sectional view of FIG. 2 shows the state in this time.

Since the suction pad 3 becomes quickly in the state of sucking four solder balls when nitrogen gas $N_2$ is introduced, the introduction of nitrogen gas $N_2$ is stopped thereafter, and the movement of the suction pad 3 that has sucked the four solder balls is started. The nitrogen gas $N_2$ used at this time also acts to inactivate the surfaces of solder balls, and prevent the solder balls from oxidation.

The suction pad 3 transports the four solder balls in the sucked state along the predetermined route, is held in the state tilted from the C-D direction (vertical direction), and releases sucking at the location where each solder ball contacts the bonding surfaces 123a to 126a, which are the first bonding surfaces of the four bonding pads of the HG assembly, and the facing bonding surfaces 110b to 113b, which are the second bonding surfaces of the lead pads. The bonding surfaces 123a to 126a of the four bonding pads, and the facing bonding surfaces 110b to 113b of the lead pads form four connecting portions by each bonding surface facing to each other.

At this time, since the bonding surfaces 123a to 126a of the four lead pads, and the facing bonding surfaces 110b to 113b of the lead pads are held at about 45 degrees from the C-D direction (vertical direction), where gravity can be utilized, and so that the virtual line where both bonding surfaces intersect becomes in parallel to a horizontal plane so that the solder balls 155 are stationary in the state of point contact to the both bonding surfaces. FIG. 1 shows this state.

FIG. 3 shows a configuration of major components of the solder-ball bonding apparatus according to The first embodiment of the present invention, which is an apparatus to reflow sequentially the four stationary solder balls contacting bonding surfaces of the bonding pads and lead pads as described above, and shows an optical unit 4 to approach solder balls for radiating laser beams, a jig 5 for holding the HG assembly 100, and a table 6 for holding the jig 5.

The jig 5 for holding the HG assembly 100 on the working surface 5a thereof is used to bond the slider 120 positioned on the end portion to the flexure tongue 104c of the flexure 104 (FIG. 8), and at this time, the working surface 5a is placed on the top (C-direction shown by an arrow). Thereafter, operation is continued in the state where the HG assembly 100 is mounted on this jig 5, and the HG assembly 100 is held in the above-described state shown in FIG. 1 as follows.

The table 6 (FIG. 3) has a disposing surface 6a inclined by 45 degrees from the C-D direction shown by an arrow (vertical direction), and a jig attaching surface 6b for attaching and holding the jig 5 so that the working surface 5a of the jig 5 contacts the disposing surface 6a. The jig 5, when attached to the jig attaching surface 6b, is held so that the working surface 5a faces downward, and maintains 45 degrees from the C-D direction shown by the arrow (vertical direction).

At this time, as FIG. 1 shows, the HG assembly 100 held by the jig 5 is positioned so that the bonding surfaces 123a to 126a of the four bonding pads, and the facing bonding surfaces 110b to 113b of the lead pads on the end portion thereof is maintained at about 45 degrees from the C-D direction (vertical direction), where gravity can be utilized, and so that the virtual line where both bonding surfaces intersect becomes in parallel to a horizontal plane.

On the table 6, on the other hand, when the jig 5 is attached to the jig attaching surface 6b, there are formed an accommodating portion to form an environmental space 6c that surrounds the end portion of the HG assembly 100, as well as a nitrogen-gas introducing pipe 6d, equivalent to an inert-gas supply portion, spatially connected to the environmental space 6c. The nitrogen-gas introducing pipe 6d is connected to a nitrogen gas cylinder (not shown) to be supplied with nitrogen gas $N_2$ in the timing described later.

The optical unit 4 corresponds to the end module of a fiber laser (not shown) that uses optical fibers 4a as the resonator, and has a hollow laser-beam path space 4b formed inside, and a series of optical lenses 4c disposed on the beam path. The optical lenses 4c condense the diverging beams outputted from the optical fibers 4a, and output the converged beams from the output opening 4d formed on the end portion of the optical unit 4.

The above-described table 6 and jig 5 correspond to the HG assembly holding means; and this HG assembly holding means, the optical unit 4, and the moving means for transporting the optical unit (not shown) correspond to the solder-ball reflow apparatus.

Next, the reflow operation of solder balls using the table 6, the jig 5, and the optical unit 4 will be described below. When the jig 5 to hold the HG assembly 100 before lead wires 110 to 113 have been electrically connected to the slider 120 is attached to the jig attaching surface 6b of the table 6 as described above, and four solder balls 155 transported by the suction pad 3 contact the bonding surface of each of bonding pads and lead pads to be the stationary state (shown in FIG. 1) as described above, the optical unit 4 is moved by the moving means (not shown) to the radiating position shown in FIG. 3, for example, the position where laser beams 15 of a prescribed spot diameter can be radiated onto the stationary solder ball 155 that contacts the pad bonding surface 126a of the bonding pad 126 and the bonding surface 113b of the lead pad 113a, as FIGS. 4(a) and (b) show. FIG. 4(a) is a diagram of the radiated portion viewed frown the direction normal to the beam axis of the laser beams 15; FIG. 4(b) is a diagram of the radiated portion viewed from the direction of the beam axis of the laser beams 15.

At the timing around this movement, a predetermined quantity of nitrogen gas $N_2$ is introduced into the nitrogen gas introducing pipe 6d of the table 6 (FIG. 3). The introduced nitrogen gas $N_2$ reaches the environmental space 6c, and inactivates the environmental space 6c by nitrogen gas $N_2$. At this time, therefore, bonding pads 123 to 126, facing lead pads 110a to 113a, and four solder balls 155 in a stationary state contacting each of the bonding surfaces of these pads are in an inactive atmosphere produced by the nitrogen gas $N_2$. The nitrogen gas $N_2$ must be introduced considering the introducing location and flow rate so as not to relocate the stationary solder ball by the gas pressure on introducing.

While this inactive atmosphere is maintained, the optical unit 4 radiates laser beams to melt and reflow the solder ball 155. As FIGS. 4(a) and (b) show, the spot diameter D2 of laser beams at this time is designed to be 150 to 200 $\mu M$ while the outer diameter D1 of a solder ball is about 120 $\mu m$.

By solder reflow under an inactive atmosphere produced by nitrogen gas $N_2$, as described above, the nitrogen gas $N_2$ covers solder during reflow to prevent oxidation. Also, as FIG. 5 shows, molten solder 7 spreads wetting the pad bonding surface 126a of the bonding pad 126 and the bonding surface 113b of the lead pad 113a by the capillary effect and the surface tension of the solder 7, to form a good reflow-bonding state (fillet).

It is preferred that the route of the three-dimensional movement of the suction pad 3 and the optical unit 4 is previously programmed in each moving means so as to be moved along this programmed route. Also in the reflow of the solder ball stationary on each of connecting portions formed by the pairs of other bonding pads and lead pads, the optical unit 4 moves along the previously programmed route, and repeats the above-described process to make each connection portion in the similar reflow-bonding state.

According to the solder-ball bonding apparatus of The first embodiment, as described above, since the solder-ball supplying operation by the section of nitrogen gas in the solder-ball feeder unit 1, and the solder-ball sucking operation by the suction pad 3 are performed simultaneously, the process until prescribed solder balls among a large number of stored solder balls are sucked into the suction pad 3 can be simplified. Also in this process, since the solder balls do not receive excessive force, accidental damages of solder balls such as cutting and breaking do not occur.

Also, since the environmental space 6c of the table 6 is inactivated before laser beams are radiated onto solder balls, the means to supply an inert gas to the optical unit 4 is not required. Therefore, since the converged laser beams can be radiated onto solder balls directly without the intervention of relaying members such as fine tubes, the radiating efficiency is significantly improved, and a compact laser equipment of a relatively low output, such as fiber laser, can be adopted. Furthermore, although high installation accuracy is required and maintenance is difficult when relaying members such as fine tubes are installed in the output path of laser beams, the solder-ball bonding apparatus of The first embodiment solves these problems.

Second Embodiment

FIG. 6 is a diagram showing an appearance of a movable portion of a solder-ball bonding apparatus in which a suction pad and an optical unit are integrally constituted according to The second embodiment of the present invention. The movable portion 10 shown in FIG. 6 has a suction pad 3 and an optional unit 4 integrally connected with a fixing band 11, and substitutes the suction pad 3 and the optional unit 4 of The first embodiment. The suction pad 3 and the optional unit 4 constituting this movable portion 10 have the same configuration of the suction pad 3 and the optional unit 4 of The first embodiment, respectively, and performs the transportation of solder balls and the reflow of solder balls in the same procedures as in The first embodiment. Therefore, the description of configurations and operations will be omitted, and only aspects different from The first embodiment will be described below. The difference is that the suction pad 3 and the optical unit 4 are integrally moved by a moving means (not shown) while the transportation of solder balls is performed by the suction pad 3 and the reflow of the solder balls is performed by the optical unit 4.

According to the solder-ball bonding apparatus of The second embodiment, as described above, since the suction pad 3 and the optical unit 4 are integrally constituted as a movable portion 10, the suction pad 3 and the optical unit 4 can be driven by one moving means.

Although the above-described embodiments are designed so that the bonding surfaces 123a to 126a of four bonding pads, and facing bonding pads 110b to 113b of lead pads maintain about 45 degrees from the vertical direction, the present invention is not limited to this angle, but various aspects can be used optionally so that the molten solder forms the best reflow-bonding state (fillet).

According to the solder-ball disposing apparatus of claim 1, since the solder ball supplying operation by the solder-ball feeder unit, and the solder ball sucking operation by the suction pad are simultaneously performed, the process until the suction of solder balls by the suction pad can be simplified. Also in this process, since the solder balls do not receive excessive force, accidental damages of solder balls such as cutting and breaking do not occur.

According to the solder-ball reflow apparatus of claim 2, since laser beams are radiated onto solder balls in the environmental space inactivated by the HG assembly holding means, it is not required to install the means for supplying an inert gas to the optical unit. Therefore, since the laser beams can be radiated onto solder balls directly without the intervention of relaying members such as fine tubes, the radiating efficiency is significantly improved, and a compact laser equipment of a relatively low output, such as fiber laser, can be adopted. Therefore, the present invention can contribute to the downsizing and cost reduction of the apparatus.

According to the solder-ball bonding apparatus of claim 3, since the suction pad and the optical unit can be integrally formed, the suction pad and the optical unit can be moved by one moving means.

According to the solder-ball disposing apparatus of claim 4, since a required number of solder balls can be transported at a time, the movement of the suction pad can be minimized and the operation efficiency can be improved.

According to the solder-ball reflow apparatus of claim 2, since the laser generating equipment can be relatively compact equipment of low costs and long life.

According to the solder-ball reflow apparatus of claim 3, since the jig that moves in the state of holding the HG assembly in the production line is made detachable, a solder-ball reflow apparatus that excels in workability can be provided.

What is claimed is:

1. A solder ball reflow apparatus for allowing a solder ball resting to reflow in a state where the ball is in contact with a first bonding surface of a pad formed on a slider held by a slider holding unit for a disk drive; and a second bonding surface of a pad formed on an end portion of a lead disposed on the slider holding unit, and positioned in the vicinity of and substantially perpendicularly to a plane including the first bonding surface, the apparatus comprising:

a head gimbal assembly holding unit for holding at least the slider holding unit with the slider so that each of the first and second bonding surfaces is tilted from a vertical direction, and having an accommodating portion for forming an environmental space to accommodate the first and second bonding surfaces, and an inert gas supply portion for supplying an inert gas to make the atmosphere of the environmental space inactive; and an optical unit having a laser beam output opening for outputting converged laser beams, wherein the laser bean output opening approaches the solder ball that has contracted both the first and second bonding surfaces to radiate laser beams of a prescribed spot diameter to the solder ball; wherein when the laser beams are radiated onto the solder ball, the atmosphere of the environmental space is made inactive by an inert gas supplied from the inert gas supply portion; and a solder ball bonding apparatus having a solder ball disposing apparatus, comprising:

a solder ball feeder unit positioned apart from the slider holding unit that holds the slider in which each of the first and second bonding surfaces is held obliquely from a vertical direction by a prescribed distance; wherein the solder ball feeder unit accommodates a plurality of solder balls in the internal space thereof, and has ejecting holes formed on the bottom of the internal space for ejecting a gas to blow the solder balls and solder ball discharging holes formed in the upper portion of the internal space for discharging the blown solder balls out of the solder ball feeder unit; and the apparatus further comprising:

a suction pad having a suction hole formed on a tip for sucking solder balls discharged from the discharging holes into the suction hole, and transporting and releasing the solder balls to and at the location where the solder balls contact the first and/or second bonding surface (s), or approach the first and second bonding surfaces; wherein the suction pad and the optical unit are integrally formed.

2. The solder ball reflow apparatus of claim 1, wherein the optical unit outputs laser beams generated from a fiber laser.

3. The solder ball reflow apparatus of claim 1, wherein the head gimbal assembly holding unit includes:

a jig for holding the slider holding means holding the slider; and a table having the accommodating portion and the inert gas supply portion, and detachably holding the jig.

* * * * *

UNITED STATES PATENT AND TRADEMARK OFFICE
CERTIFICATE OF CORRECTION

PATENT NO. : 6,742,694 B2
DATED : June 1, 2004
INVENTOR(S) : Satoh et al.

Page 1 of 1

It is certified that error appears in the above-identified patent and that said Letters Patent is hereby corrected as shown below:

<u>Title page,</u>
Item [75], Inventors, the city for "Takuya Satoh" should read -- Miura-gun --.

Signed and Sealed this

Ninth Day of November, 2004

JON W. DUDAS
*Director of the United States Patent and Trademark Office*